(12) United States Patent
Christoph

(10) Patent No.: US 7,881,482 B2
(45) Date of Patent: Feb. 1, 2011

(54) AUDIO ENHANCEMENT SYSTEM

(75) Inventor: Markus Christoph, Straubing (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 1235 days.

(21) Appl. No.: 11/434,496

(22) Filed: May 15, 2006

(65) Prior Publication Data

US 2006/0259531 A1 Nov. 16, 2006

(30) Foreign Application Priority Data

May 13, 2005 (EP) ................................ 05010513

(51) Int. Cl.
*H03G 5/00* (2006.01)

(52) U.S. Cl. .................. 381/103; 381/66; 381/94.2; 381/94.3; 381/71.11; 381/71.121

(58) Field of Classification Search ....... 381/94.1–94.3, 381/86, 83, 93, 96, 103, 59, 98–99, 71.1, 381/71.11–71.12, 66
See application file for complete search history.

(56) References Cited

U.S. PATENT DOCUMENTS

| | | |
|---|---|---|
| 4,118,601 A | 10/1978 | Yeap |
| 4,306,113 A | 12/1981 | Morton |
| 4,340,780 A | 7/1982 | Odlen |
| 4,709,391 A | 11/1987 | Kaizer et al. |
| 4,823,391 A | 4/1989 | Schwartz |
| 4,893,342 A | 1/1990 | Cooper et al. |
| 4,910,779 A | 3/1990 | Cooper et al. |
| 4,975,954 A | 12/1990 | Cooper et al. |
| 5,034,983 A | 7/1991 | Cooper et al. |
| 5,136,651 A | 8/1992 | Cooper et al. |
| 5,333,200 A | 7/1994 | Cooper et al. |

(Continued)

FOREIGN PATENT DOCUMENTS

DE 10027618 1/2001

(Continued)

OTHER PUBLICATIONS

Weiss et al.: "A Subband Adaptive Equalization Structure", IEEE Colloquium Novel DSP Algorithms and Architectures for Radio Systems, Sep. 28, 1999, pp. 4-1.

(Continued)

*Primary Examiner*—Devona E Faulk
*Assistant Examiner*—Disler Paul
(74) *Attorney, Agent, or Firm*—O'Shea Getz P.C.

(57) ABSTRACT

An audio enhancement system is provided for compensating for distortions (e.g., linear distortions) of a sound signal reproduced by an audio system in a listening room. The audio enhancement system includes analysis filters that generate a plurality of analysis output signals from an audio signal to be enhanced. The system also includes synthesis filters that generate an enhanced audio signal from a number of synthesis input signals. The number of analysis output signals and the number of synthesis input signals preferably are equal. Signal processing elements between the analysis filters and the synthesis filters generate one of the synthesis input signals from a respective one of the analysis output signals to perform an inverse filtering for linearizing an unknown transfer function indicative of the audio system and the listening room in the respective frequency range.

20 Claims, 9 Drawing Sheets

U.S. PATENT DOCUMENTS

| | | | |
|---|---|---|---|
| 5,680,450 A | | 10/1997 | Dent et al. |
| 5,694,476 A | | 12/1997 | Klippel |
| 5,852,667 A | * | 12/1998 | Pan et al. ............... 381/71.1 |
| 6,760,451 B1 | | 7/2004 | Craven et al. |
| RE40,281 E | * | 4/2008 | Tzannes et al. ............ 704/205 |
| 2004/0131203 A1 | * | 7/2004 | Liljeryd et al. .............. 381/98 |
| 2004/0268203 A1 | * | 12/2004 | Koyata ..................... 714/752 |
| 2005/0157891 A1 | * | 7/2005 | Johansen .................. 381/103 |
| 2005/0271216 A1 | * | 12/2005 | Lashkari .................... 381/59 |

FOREIGN PATENT DOCUMENTS

| | | |
|---|---|---|
| EP | 0687126 | 12/1995 |
| WO | 02056635 | 7/2002 |

OTHER PUBLICATIONS

Harma et al.: "Frequency-Warped Signal Processing for Audio Applications", Journal of the Audio Engineering Society, vol. 48, No. 11, Nov. 2000, pp. 1011-1031.

Neely et al.: "Invertibility of a Room Impulse Response", Journal of the Acoustical Society of America, vol. 66, No. 1, Jul. 1979, pp. 165-169.

Miyoshi et al.: "Inverse Filtering of Room Acoustics", IEEE Transactions on Acoustics, vol. 36, No. 2, Feb. 1, 1988, pp. 145-152.

Jörg Kliewer, "Beiträge zum Entwurf modulierter Filterbänke für verschiedene Teilbandabtastraten" [On designing modulated filter banks for different sub-band sampling rates], PhD thesis, Shaker Publishers, 1999, vol. 16.

* cited by examiner

AUDIO ENHANCEMENT SYSTEM

CLAIM OF PRIORITY

This patent application claims priority to European Patent Application serial number 05 010 513.9 filed on May 13, 2005.

1. Field of the Invention

This invention relates in general to a system for improving the sound reproduced by an audio system in a listening room such as a vehicle interior, and in particular to a system that compensates for distortions caused by the audio system and the listening room.

2. Related Art

Audio signals recorded on CDs, DVDs or other media are generally formatted either during or after the recording such that the desired aural effect is obtained. If the audio signal is replayed through high-quality headphones, the desired aural effect is accurately reproduced. In contrast, when listening to a recording in a room, the original aural characteristics are typically distorted, depending on the size, shape and layout of the room. This is due to the transfer function of the room and to the extent reflections that occur. The audio signal is filtered by the transfer function of the total signal path between the loudspeaker and the listening position in the room, and is corrupted or colored as a result. An inverse filter can be employed to equalize the coloring caused by the transfer function, which is usually not known. This type of equalizing filter is required to have the inverse characteristic of the unknown transfer function so that the overall system becomes linear once again.

There is a need for an improved inverse smoothing filter, which may also be referred to as an equalizer.

SUMMARY OF THE INVENTION

An audio enhancement system compensates for distortions of a sound signal reproduced by an audio system in a listening room. The audio enhancement system includes analysis filters that generate a number of analysis output signals from an audio signal to be enhanced. The system also includes synthesis filters that generate an enhanced audio signal from a number of synthesis input signals. The number of analysis output signals and the number of synthesis input signals may be equal. Signal processing elements between the analysis filters and the synthesis filters generate one of the synthesis input signals from a respective one of the analysis output signals to perform an inverse filtering for linearizing an unknown transfer function established by the audio system and the listening room in the respective frequency range.

The other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like reference numerals designate corresponding parts and signals throughout the different views.

DETAILED DESCRIPTION

To design an inverse filter for linearizing an unknown transfer function, a number of algorithms may be considered, one of which is the Filtered X (reference or input signal) Least Mean Square (FXLMS) algorithm. The transfer function to be inverted is generally an all-pass filter function which basically cannot be fully inverted because a non-causal filter is required. However, by considering the minimum phase component (e.g., limiting consideration to the minimum phase component), full inversion can be achieved for the minimum phase component by compensating the zero positions, which are known in minimum-phase filters to be located within the standardized circuit, with corresponding pole places. Nonetheless, this approach works to a relatively approximate degree if the entire unknown system is to be inverted. An approximation technique of this kind is implemented, for example, in a system using the aforementioned FXLMS algorithm, as illustrated in FIG. 1.

Figure 1:
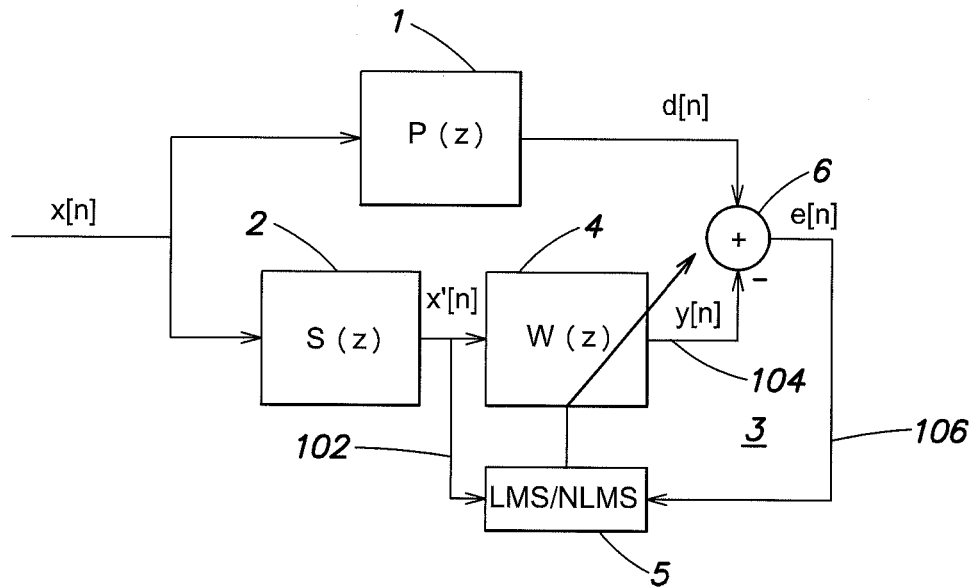
FIG. 1 is a block diagram illustration of a system implementing a Filtered X Least Mean Square (FXLMS) algorithm.

In the system of FIG. 1, an input signal x[n] (also referred to as a reference signal) is supplied to a partial system 1 having a reference transfer function P(z), and to a partial system 2 (e.g., a loudspeaker-room-listener system) having an unknown transfer function S(z). The partial system 2 outputs a filtered input signal x'[n] on a line 102 that is supplied to an adaptive filter comprising a filter core 4 and a Least Mean Square/Normalized Least Mean Square (LMS/NLMS) adaptation unit 5 for controlling the filter core 4. The filter core 4 provides a filtered output signal y[n] on a line 104. The adaptation unit 5 receives the filtered input signal x'[n] and an error signal e[n] and generates a control signal for controlling the filter coefficients of the filter core 4. A subtraction unit 6 receives a filtered reference signal d[n] and the filtered output signal y[n], and provides the error signal e[n] on a line 106 indicative of the difference. The adaptive filter foul's an inverse filter 3 having a transfer function W(z).

If the inverse filter 3 having the transfer function W(z) is utilized (e.g., solely) to equalize the unknown transfer function S(z), the reference transfer function P(z) may not change the reference or input signal, x[n], but may instead delay it. This delay is commonly referred to as the modeling delay and equals approximately half the length of the inverse filter 3. However, if it is desired to equalize the unknown transfer function S(z) and also have the transfer function W(z) be such that the series circuit of S(z) and W(z) complies with a specific function, then P(z) includes this specific function. This situation can be used advantageously in the design of a target function, particularly if noise signals, such as those experienced in cars, have on average the same or a similar power spectral density in that the target function approximately traces the average power spectral density of the noise.

The error signal, e[n], may be calculated with reference to FIG. 1 as follows:

$$e[n] = d[n] - y[n] \quad (1)$$
$$= (p^T[n] \cdot x[n]) - (w^T[n] \cdot x'[n])$$
$$= (p^T[n] \cdot x[n]) - (w^T[n] \cdot (s^T[n] \cdot x[n])),$$

where x[n] is the input signal vector at a time n as expressed by $$x[n] = [x[n]x[n-1] \ldots x[n-L+1]]^T \quad (2)$$

L is the filter length of W(z), and p[n] is the filter coefficient vector of P(z) at a time n as expressed by $$p[n] = [p_0[n]p_1[n] \ldots p_{L-1}[n]]^T \quad (3)$$

s[n] is the filter coefficient vector of S(z) at a time n as expressed by $$s[n] = [s_0[n]s_1[n] \ldots s_{L-}[n]]^T \quad (4)$$

and w[n] is the filter coefficient vector of W(z) at a time n as expressed by $$w[n] = [w_0[n]w_1[n] \ldots w_{L-1}[n]]^T. \quad (5)$$

The filter coefficient update of w[n] may be performed iteratively, that is, at each time n. The filter may be designed such that the filter coefficients w[n] are calculated so that the current squared error $e^2[n]$ is relatively low. This may be normally achieved in using the LMS (or NLMS) algorithm. The update is referred to as the coefficient vector w[n] and can be summarized as follows:

$$w[n+1] = w[n] + \mu * x'[n] * e[n], \quad (6)$$

$$w[n+1] = w[n] + \frac{\mu}{x'[n]^T * x'[n]} * x'[n] * e[n], \quad (7)$$

where μ is the adaptation step size and x'[n] is the input signal vector previously filtered with S(z) as expressed by $$x'[n] = [x'[n]x'[n-1] \ldots x'[n-L+1]]^T. \quad (8)$$

Using an inverse filter designed directly with the FXLMS algorithm may create problems. For example, audible artifacts such as pre-echoes may occur, and an inverse filter at times requires relatively many filter coefficients, which are generally not readily available in practical applications. Otherwise equalization may be possible to a base limit frequency, which is set increasingly lower the longer the inverse filter is. Unfortunately, the human ear can distinguish between frequencies relatively well, particularly in the spectral domain, which means that humans react in a relatively sensitive manner to spectral errors. Therefore in one embodiment, the inverse filter has a high level of spectral resolution, particularly in the lower spectral domain, signifying, however, that the filter is required to be relatively long.

One way of solving this problem, for example, is to use a filter with a non-linear frequency resolution, that is one that has high resolution for low frequencies and deteriorating resolution for increasingly higher frequencies. Such known filters are referred to as warped, Kautz, or Lagurerre filters, among others. These filters can also be designed as adaptive filters, but as such they no longer exhibit favorable properties. Consequently, an indirect implementation may be used, that is, conversion of a conventional, relatively long adaptive Finite Impulse Response (FIR) filter after its adaptation to a filter with non-linear frequency resolution.

However, with increasing length, adaptive FIR filters suffer increasingly from the occurrence of quantization errors. These filters thus become more instable or imprecise, meaning that even their direct implementation causes problems in practical cases. A feasible technique of implementing relatively long adaptive FIR filters in practice is, for example, to design the adaptive filter directly in the spectral domain or in sub-bands (i.e., using a multi-rate system).

Each of the two approaches has its own advantages and disadvantages. One advantage of calculating in the spectral domain is that the relatively efficient Fast Fourier Transformation (FFT) and Inverse Fast Fourier Transformation (IFFT) processing techniques can be used for the transition from the time domain to the frequency domain and in the other direction, respectively. Adaptive filters also adapt relatively quickly and accurately in the spectral domain. A disadvantage of calculating in the spectral domain is the relatively large amount of computing resources required. In contrast, an implementation using a multi-rate system requires less memory, depending on the design, yet it is either relatively inaccurate or needs longer computing times. Both solutions can be relatively easily scaled, and can therefore be flexibly adapted to the resources available.

The adaptive filter typically has sufficiently high frequency resolution. For processing in the spectral domain, a correspondingly long FFT is used for the transformation from the time domain to the frequency domain, which necessarily causes a further problem of longer signal delays. An implementation in sub-bands using a mixture of different signal processing techniques can keep the signal delay to a relatively low value, while at the same time enabling the preferred signal processing technique with non-linear frequency resolution to be realized, at least approximately. To do so, the time signal is first split into different frequency bands, which reduces the sampling rate and provides narrowband time signals. Depending on which spectral domain a narrowband time signal belongs to, it can be processed with a longer or shorter adaptive filter to obtain a differentiated, frequency-dependent spectral resolution. The lengths of the corresponding adaptive filters in the sub-bands are chosen such that the resulting full frequency resolution approximately matches that of human hearing, for example, it approximately follows the Bark frequency scheme.

A relatively efficient technique of implementing a filter bank in terms of memory and computing time is, for example, to use a critically sampled poly-phase Quadrature Mirror Filter (QMF) bank having connected Infinite Impulse Response (IIR) all-pass filters in a tree structure. A critically sampled, single-stage poly-phase analysis/synthesis system having connected IIR all-pass filters is illustrated in FIG. 2.

Figure 2:
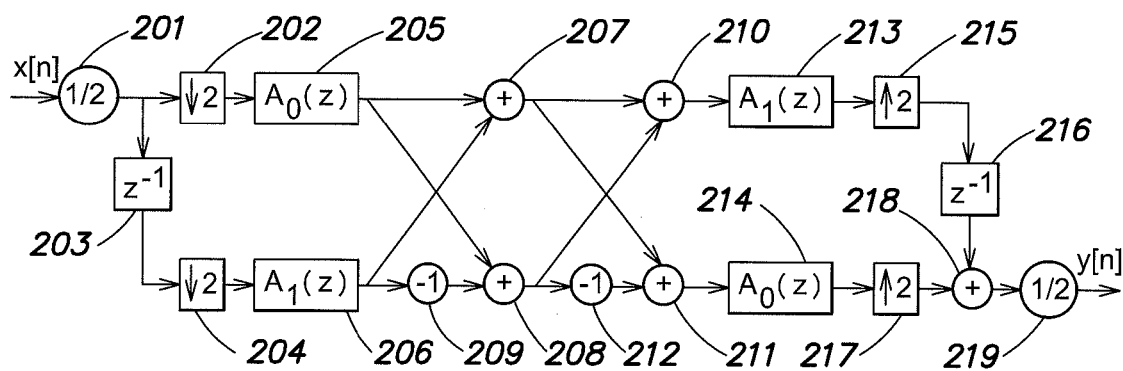
FIG. 2 is a block diagram illustration of a single-stage poly-phase analysis/synthesis system having Infinite Impulse Response (IIR) all-pass filters.

In the filter of FIG. 2, the input signal x[n] is divided by 2 in a divider unit 201 and then applied to a sample rate down-converter 202 and via a delay unit 203 to a sample rate down-converter 204. The sample rate down-converters 202, 204 are each followed by a filter 205, 206 having a transfer function $A_0(z)$ and $A_1(z)$, respectively. The output of the filter 205 is applied to an adder unit 207 and an adder 208. The output of the filter 206 is applied to the adder 207 and via an inverter 209 to the adder 208. Further, the output of the adder unit 207 is applied to adder 210 and adder 211. The output of the adder 208 is applied to the adder unit 210 and via an inverter 212 to the adder 211. Filters 213 and 214 are connected downstream of the adders 210 and 211, respectively, where the filter 213 has the transfer function $A_1(z)$ and the filter 214 has the transfer function $A_0(z)$. The output of the filter 213 is applied via a sample rate up-converter 215 and a delay unit 216 to an adder unit 218. The output of the filter 214 is applied via a sample rate up-converter 217 to the adder unit 218 which provides an output signal y[n] via a divider unit 219 for dividing by 2.

A filter bank with a tree structure is obtained by continuous insertion in each case of an analysis/synthesis pair in the signal processing area of the preceding stage.

Figure 3:
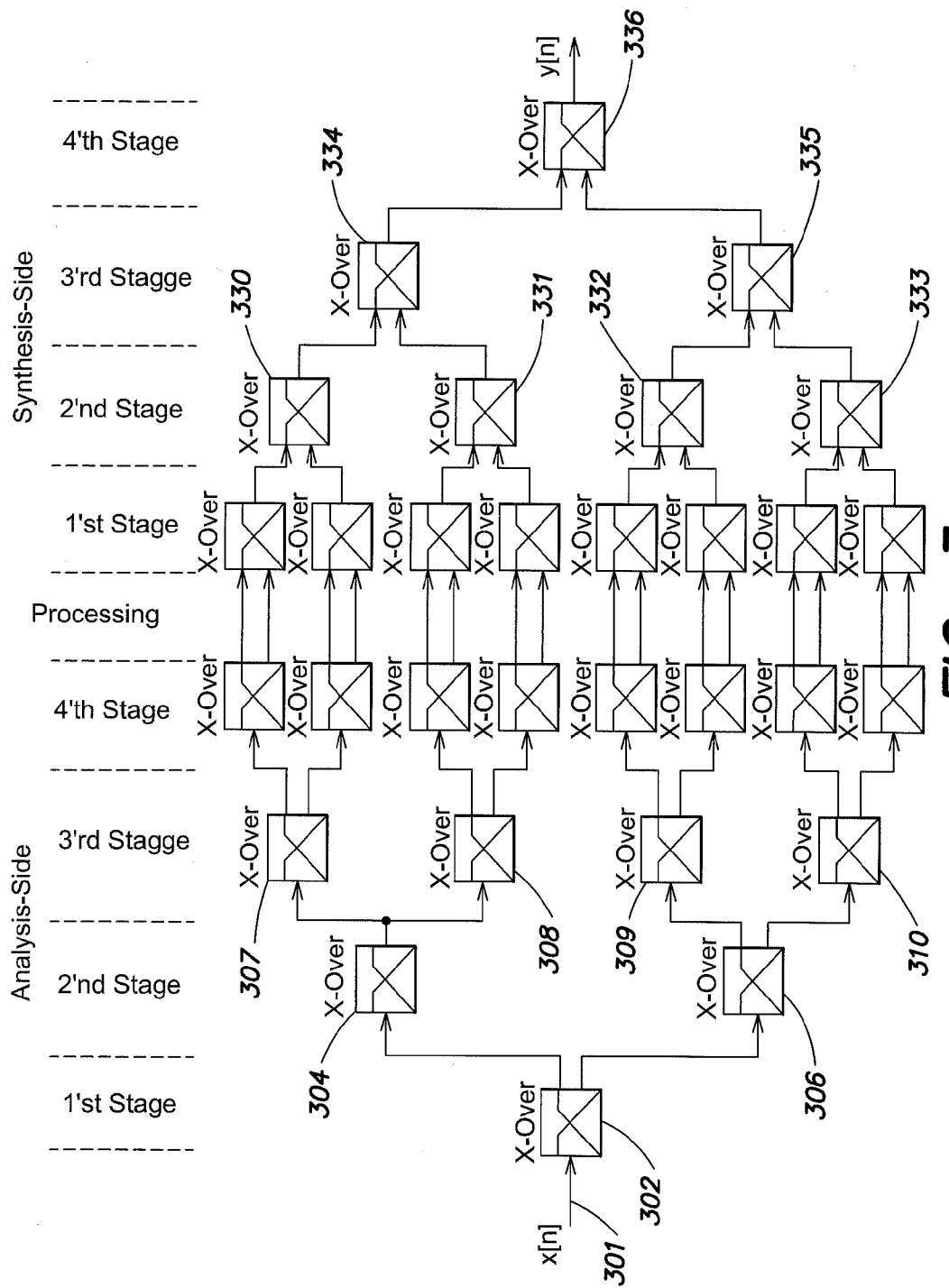
FIG. 3 is a signal flow diagram of a 4-stage filter bank with a tree structure.

FIG. 3 is a signal flow diagram of a 4-stage filter bank with a tree structure. The filter bank comprises fifteen analysis filters $Fs_i$ (i=1 ... 15) on the left side of FIG. 3 spread over four stages. The filter bank also includes fifteen synthesis filters $Fm_i$ (i=1 ... 15) on the right side of FIG. 3 also spread over four stages. A first analysis stage 302 comprises one analysis filter splitting an input signal x[n] on a line 301 into two signals for two analysis filters in the second stage. Two analysis filters 304, 306 in the second analysis stage generate, accordingly, four signals for a third analysis stage that comprises four analysis filters 307-310. Finally a fourth analysis stage contains eight analysis filters that receive eight signals from the third analysis stage, and generate sixteen output signals which are then further processed by signal processing units (not shown in detail in FIG. 3). The signal processing units provide sixteen input signals for the first synthesis stage having eight synthesis filters for providing eight signals for a second synthesis stage. The second synthesis stage comprises four synthesis filters 330-333 providing four signals to a third synthesis stage having two synthesis filters 334-335. Finally a fourth synthesis stage comprises a synthesis filter 336 that provides the output signal y[n]. Thus, the signal processing units comprise a plurality of adaptive sub-band filters. Each sub-band filter receives one of the analysis output signals and generates one of the synthesis input signals. Each sub-band filter forms an inverse filter for linearizing the unknown transfer function established by the audio system and the listening room in the respective frequency range.

Adaptive filters implemented using a critically sampled multi-rate system typically suffer from the problem that adjacent bands overlap each other, which causes aliasing to occur. Although the aliasing can be reduced by steeper transitions between the limiting bandpass filters, it typically cannot be fully avoided. An oversampled filter bank may alleviate the situation (see, for example, Jörg Kliewer, "Beiträge zum Entwurf modulierter Filterbänke für verschiedene Teilbandabtastraten" [On designing modulated filter banks for different sub-band sampling rates], PhD thesis, Sharker Publishers, 1999). Depending on the sampling rate used, the filter bank in some cases needs greater computing resources, which is not considered to be a large drawback in view of the relative efficiency of the implementation. Moreover, no known implementation of an oversampled filter bank using the uncomplicated, connected IIR all-pass filters exists. Thus, an implementation with FIR filters is used, which however increases the memory requirements. In the present case, it is for the most part irrelevant whether the FIR filter bank is realized for example using a multi-complementary, modulated or poly-phase filter bank.

Figure 4:
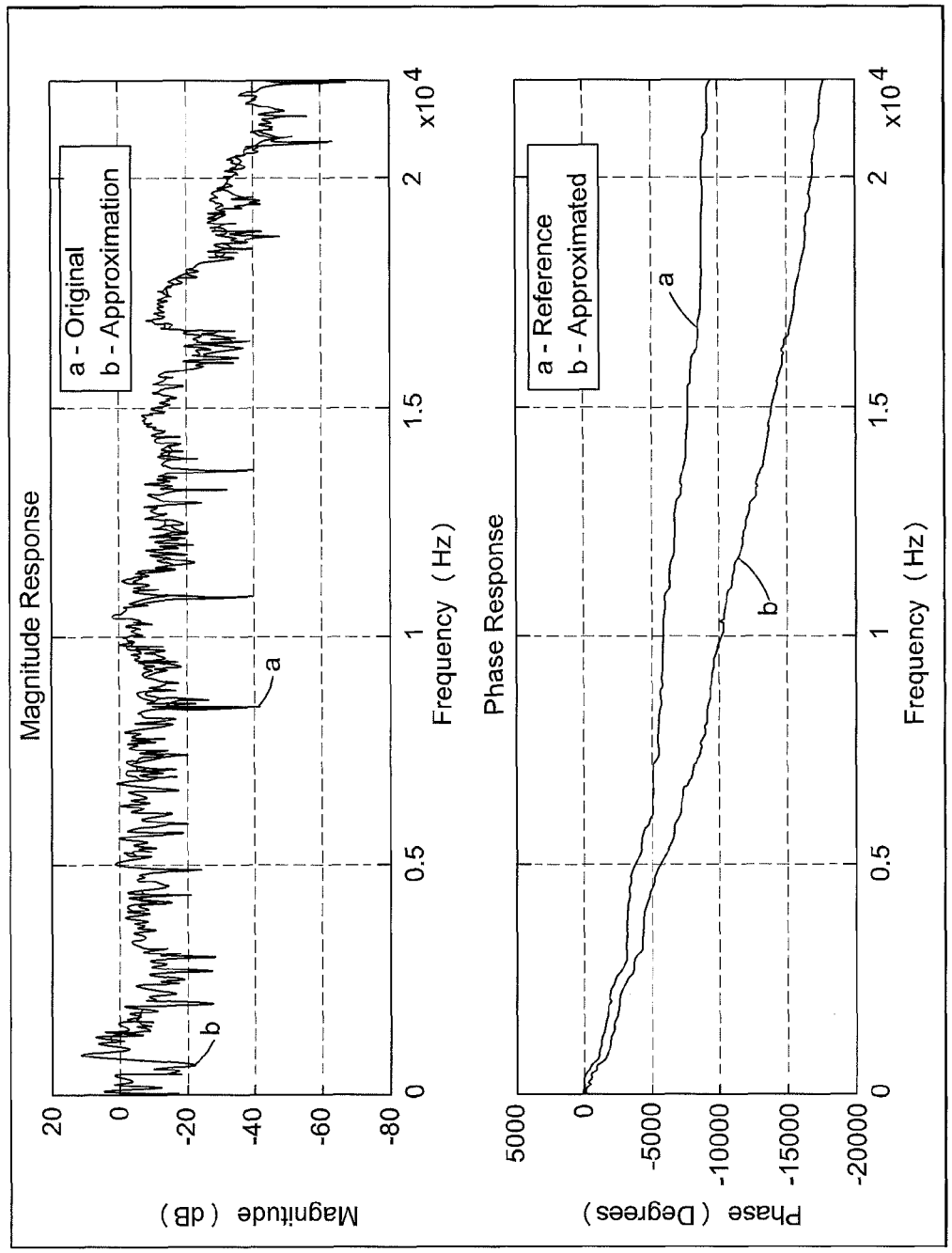
FIG. 4 is a graph illustrating the magnitude response and phase response of a 16-band, critically sampled sub-band adaptive filter.

FIG. 4 illustrates an example of the effects of aliasing errors in the approximation of an unknown system using a sub-band adaptive filter with a critically sampled 4-stage poly-phase filter bank having a tree structure. The length of the corresponding adaptive filters in the 16 bands is defined in each case as L=128.

As can be seen from FIG. 4, the approximated model differs to any significant extent from the original at the individual band limits. Overall, the errors remain within acceptable limits.

It is generally not important how the aliasing errors behave during the approximation with the original, but rather their inverse behavior. For this reason, the previous example is used again, but this time an adaptive filter is arranged in each sub-band, which is no longer iterated using the NLMS algorithm, but instead the inverse model of the original is approximated using the FXNLMS algorithm.

Figure 5:
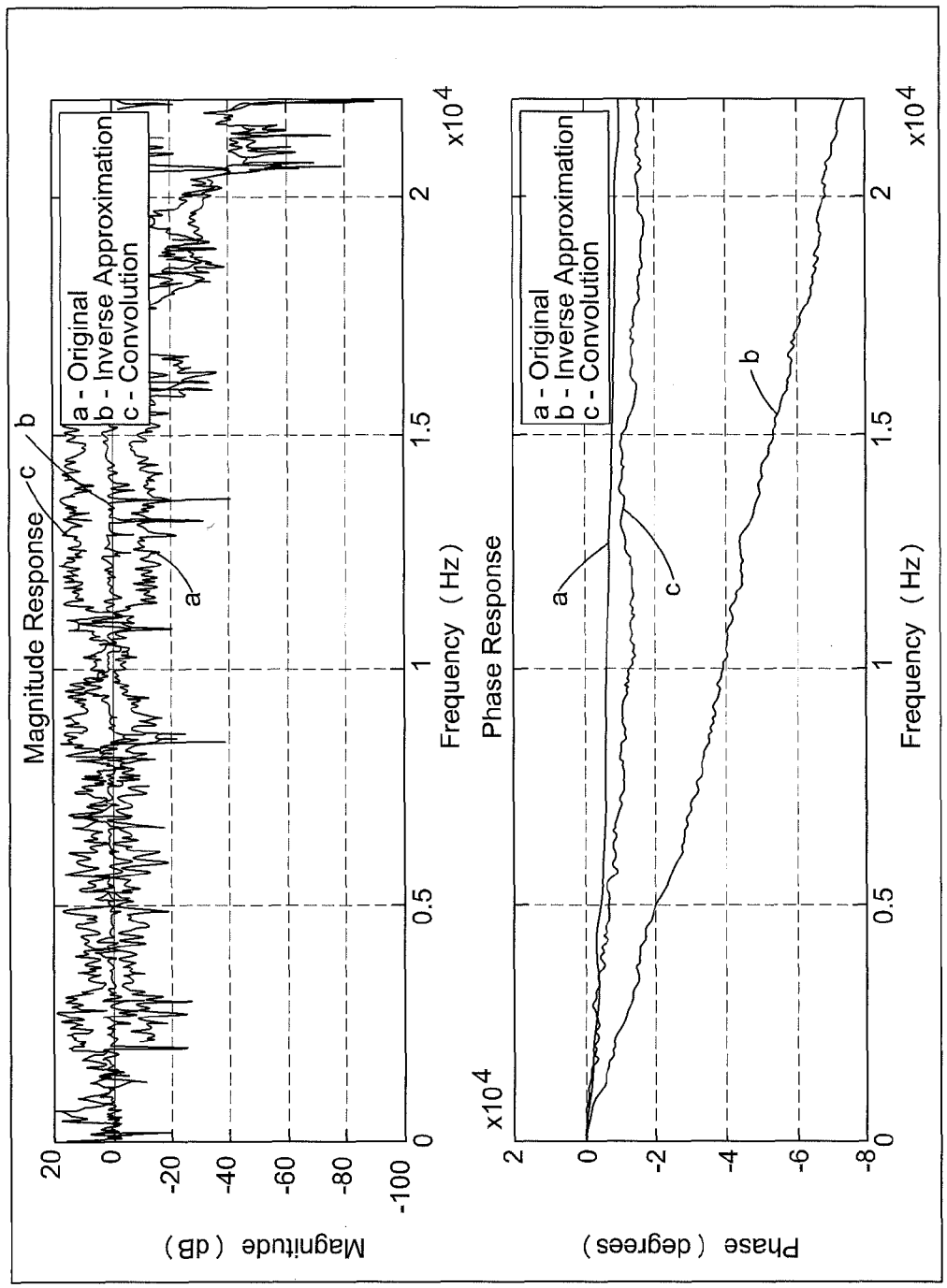
FIG. 5 is a graph illustrating the magnitude response and phase response of a 16-band, critically sampled, inverse sub-band adaptive filter.

FIG. 5 is a diagram illustrating the performance of a 16-band, critically sampled, inverse sub-band adaptive filter. From FIG. 5, it can be seen that the band limits of the individual sub-bands can no longer be clearly localized, that is, during approximation of the inverse original transfer function the aliasing errors appear to be less critical than for the approximation of the original transfer function illustrated in FIG. 4.

To keep the associated errors within limits, an oversampled filter bank is preferred if a filter bank is used. The previous figures illustrate that relatively considerable savings in resources (computing time as well as memory) can be achieved if certain errors are accepted.

Figure 6:
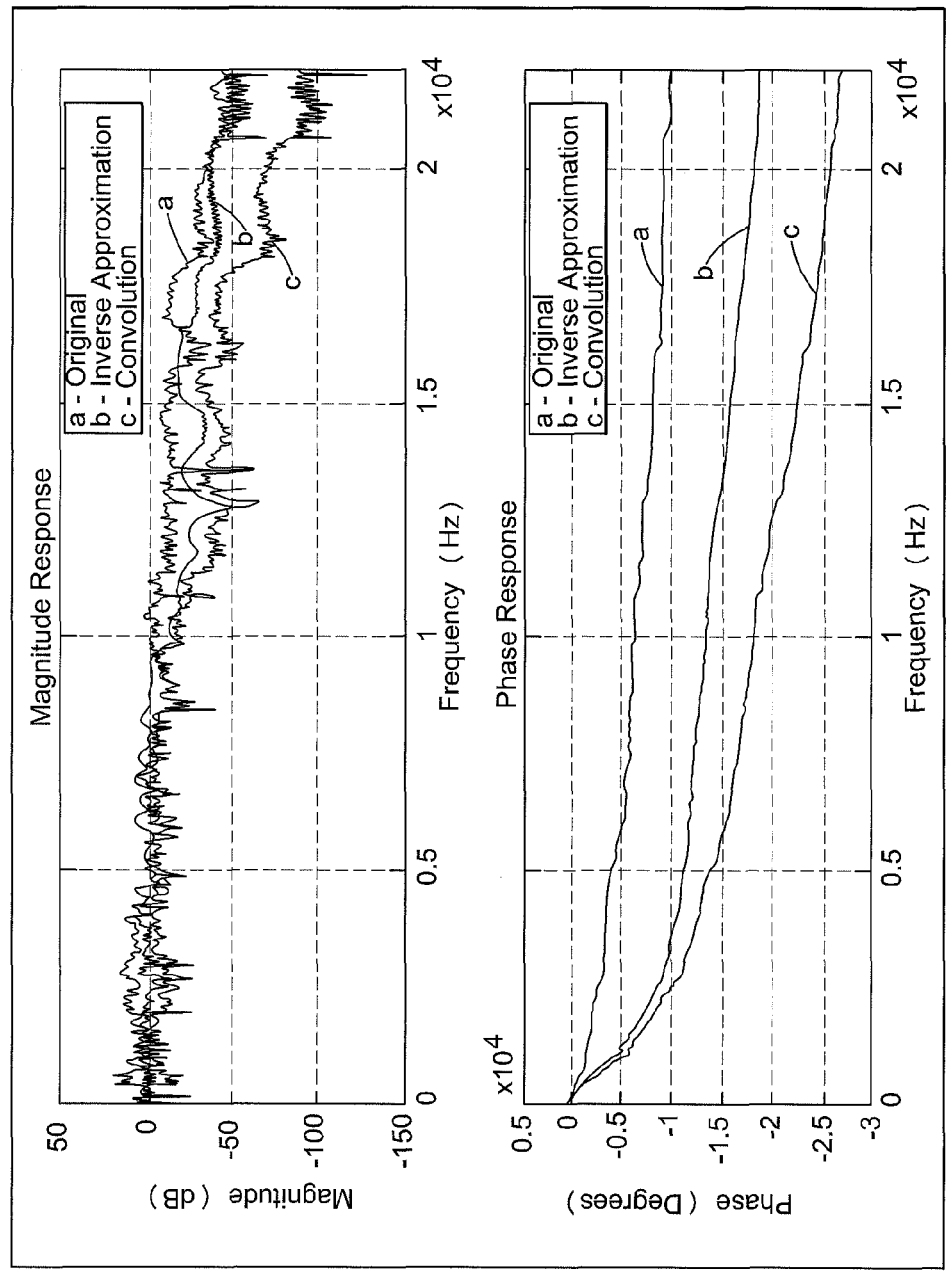
FIG. 6 is a graph illustrating the magnitude response and phase response of a filter bank in which the lengths of the individual adaptive sub-band filters are adapted to the Bark frequency response.

In the two previous illustrations, an adaptive filter with the same length was used for each sub-band. The length was selected such that a sufficiently high frequency resolution was obtained in the lower frequency domain. As discussed, this resolution performance is not required for the upper frequency domain owing to the frequency resolution characteristics of the human ear. Consequently, the lengths of the adaptive filters for the upper sub-bands decrease steadily with increasing frequency. A filter bank designed as outlined above in which the lengths of the individual adaptive sub-band filters are adapted to the Bark frequency response exhibit performance corresponding to that shown later in FIG. 6.

In FIG. 5, when determining the inverse filter, a target frequency response may be specified. The adaptation technique attempts to produce the inverse filter such that a chain circuit of the same filter with the original transfer function matches the specified target transfer function. Also, the target function is oriented approximately with the mean power spectral density of the noise signal. Low-frequency noise signals dominate in automobiles, implying that a target transfer function, such as that illustrated in FIG. 7, may be specified.

Figure 7:
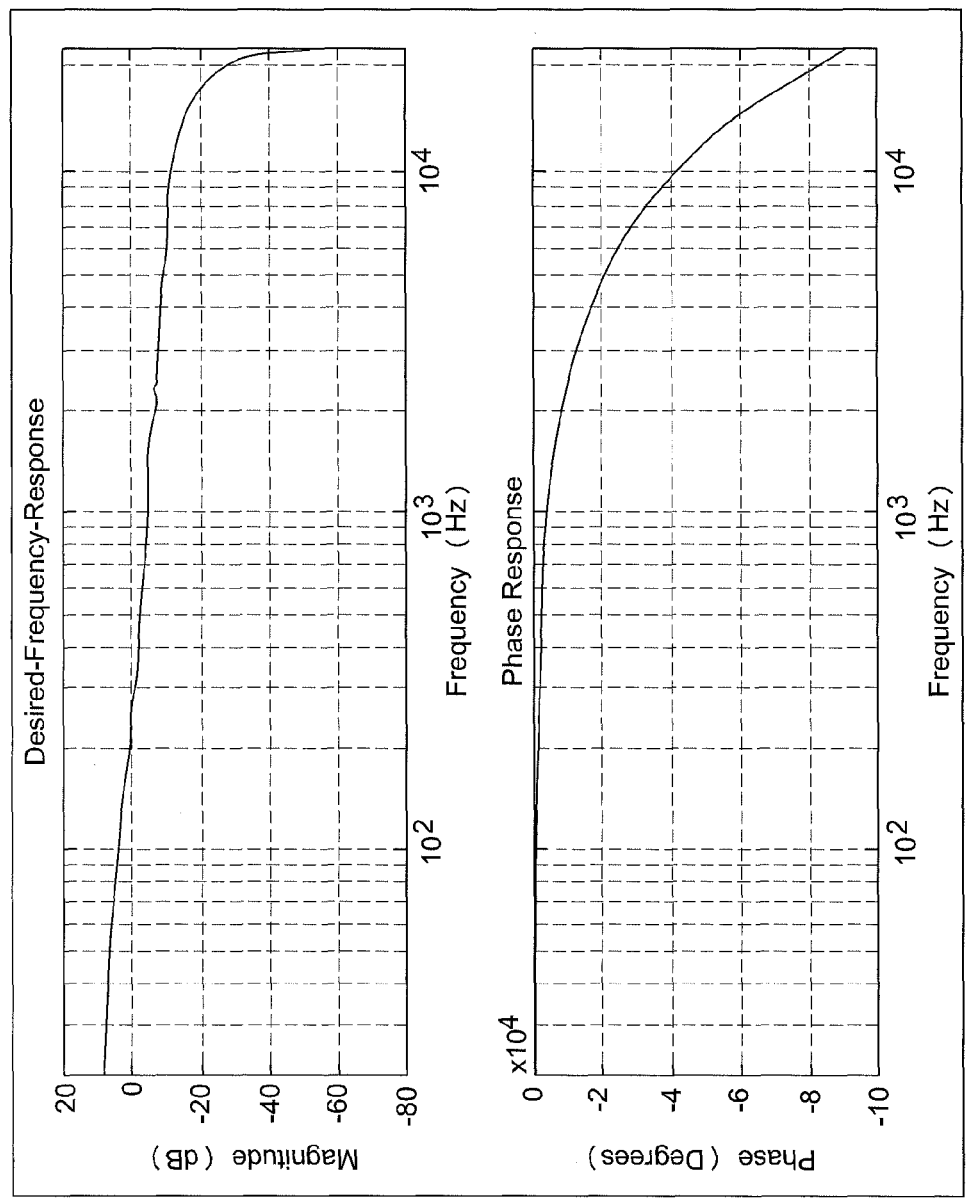
FIG. 7 is a graph illustrating the magnitude response and phase response of a target transfer function for automobiles.
Figure 8:
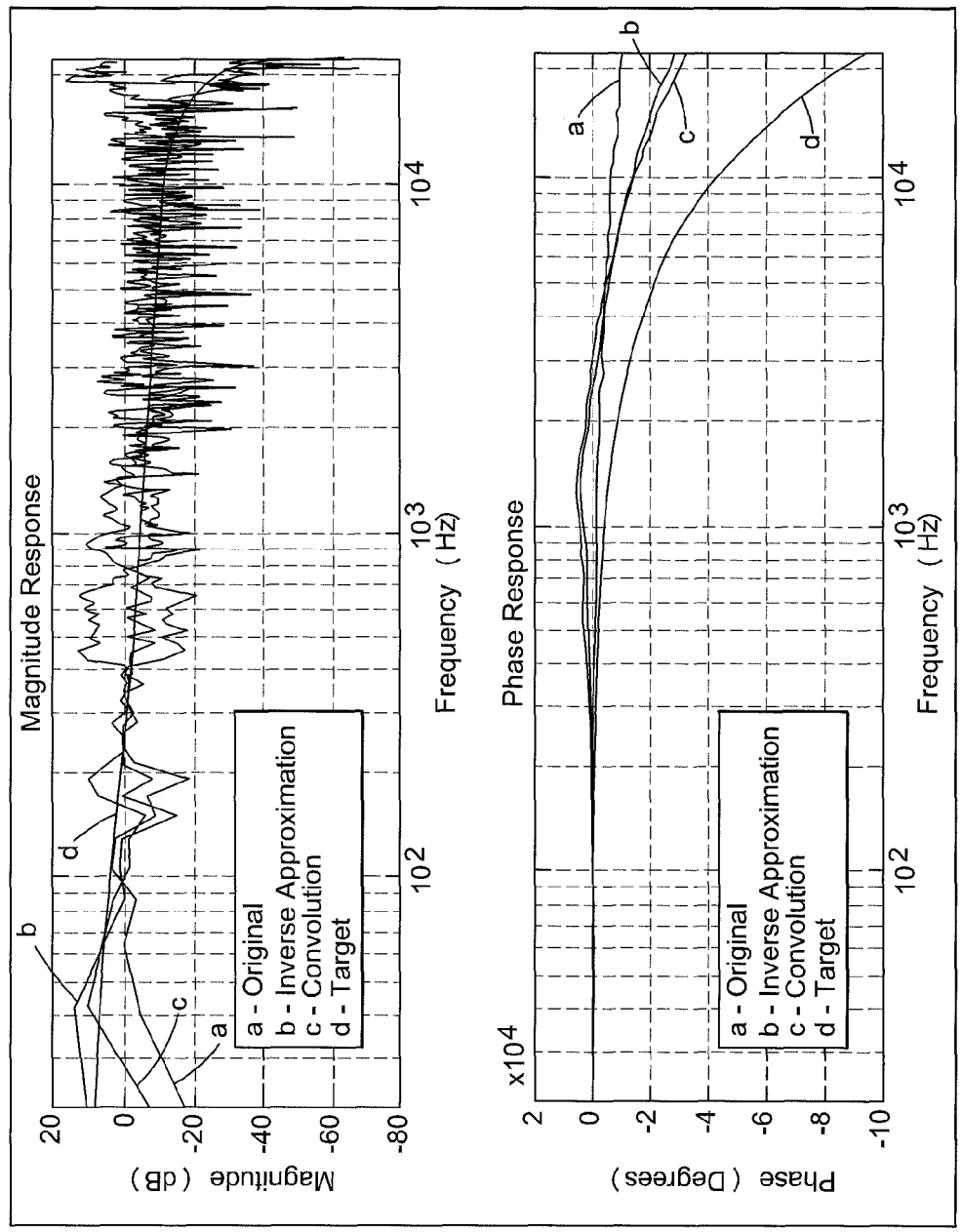
FIG. 8 is a graph illustrating the magnitude response and phase response of a 16-band, critically sampled, inverse sub-band adaptive filter approximating a specified target transfer function.

Due to the logarithmic representation of FIG. 7, it is not immediately evident that the phases of the target transfer function are linear. Other than that, one can see that the function falls continuously with increasing frequency, which mainly also corresponds to the typical impulse response of the interior of an automobile. Maintaining the target function at a constant value from a specific base limit frequency typically causes a relatively large rise in the upper frequency domain. By selecting the target transfer function as discussed above, the rise in the function remains generally moderate, even in the upper frequency domain. This is illustrated in the example of FIG. 8, which illustrates the performance of a 16-band, critically sampled, inverse sub-band adaptive filter approximating a specified target transfer function. As can be seen from FIG. 8, the convolution of the original impulse response with that of the approximated inverse filter matches relatively closely the specified target transfer function without the need for relatively strong increases in the upper frequency domain.

A minimum phase transfer function can be inverted in a direct way. However, the all-pass splitting (which is needed to isolate the minimum phase component in a maximum phase system) is relatively difficult to accomplish, at least in real time. The minimum phase component of the transfer function can be iteratively determined directly using the Linear Predictive Coding (LPC) coefficients. A relatively efficient technique of calculating the LPC coefficients is provided by the Gradient Adaptive Lattice (GAL) algorithm. Using this algorithm, any number of LPC coefficients can be iteratively computed without the need for the relatively complex Levinson-Durbin recursion.

Figure 9:
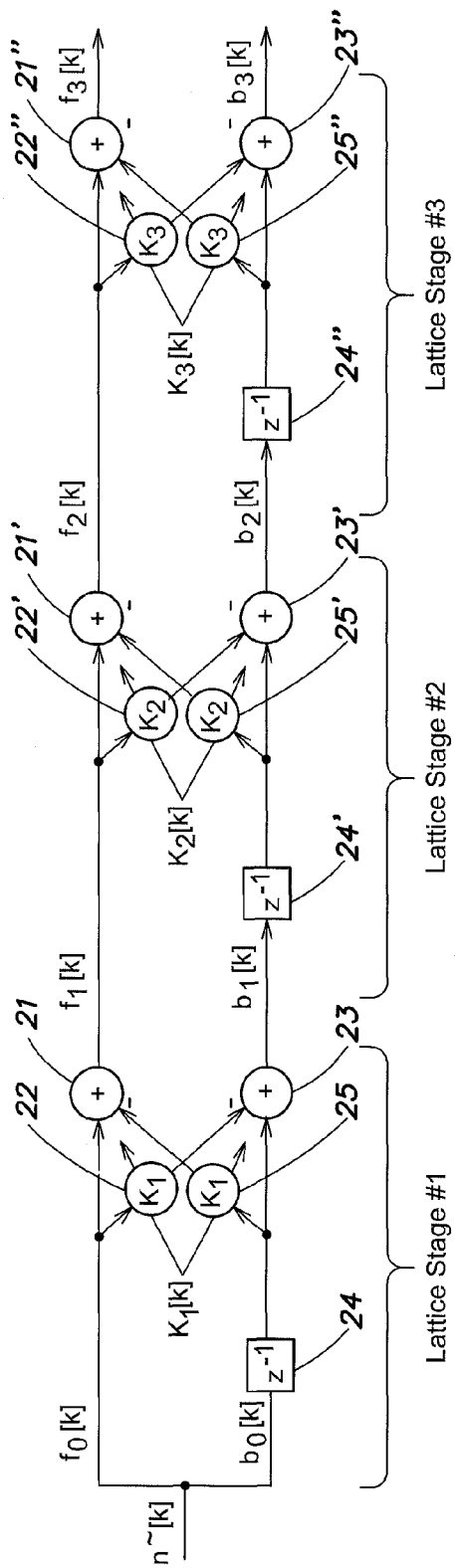
FIG. 9 is a block diagram illustration of an Adaptive Lattice Predictor (ALP) $4^{th}$ order filter.

The filter structure with which the GAL algorithm can be realized may be an Adaptive Lattice Predictor (ALP) structure. An example of an Adaptive Lattice Predictor (ALP) $4^{th}$ order filter is illustrated in FIG. 9, in which the signal n[k] to be filtered is split into a signal $f_0[k]$ and a signal $b_0[k]$. The signal $f_0[k]$ is applied to a subtraction unit 21 and to a multiplier unit 22 where it is multiplied by a constant factor $K_1$. The signal output of the multiplier unit 22 is applied to a subtraction unit 23 that also receives a signal from a delay unit 24 that delays the signal $b_0[k]$. The delayed signal $b_0[k]$ is also supplied to a multiplier unit 25 where it is multiplied by the constant factor $K_1$. The signal output of the multiplier unit 25 is applied to the subtraction unit 21, which outputs a signal $f_1[k]$, while the subtraction unit 23 outputs a signal $b_1[k]$. The subtraction units 21, 23, the multipliers 22, 25, and the delay unit 24 form a first Lattice stage, which is followed by two additional Lattice stages. Accordingly, the signals $f_1[k]$, $b_1[k]$ are applied to the second stage that outputs signals $f_2[k]$, $b_2[k]$, which are applied to the third stage that provides signals $f_3[k]$, $b_3[k]$ as output signals of the ALP $4^{th}$ order filter. The second and third Lattice stage comprise subtraction units 21', 23', multipliers 22', 25', delay unit 24' or subtraction units 21", 23", multipliers 22", 25", delay unit 24", respectively.

The ALP filter reproduces the minimum phase part of the unknown transfer function. The LPC coefficients of the ALP filter ($K_1, \ldots, K_{N-1}$) are calculated iteratively using the GAL algorithm as follows:

$$K_n[k+1] = \qquad (9)$$
$$K_n[k] + \frac{\alpha}{P_n[k]} * (f_{n-1}[k] * b_n[k] + b_{n-1}[k-1] * f_n[k])$$
$$P_n[k] = (1-\alpha) * P_n[k-1] + \alpha * (f_{n-1}[k]^2 + b_{n-1}[k-1]^2)$$
$$n = 1, \ldots, N-1$$

Figure 10:
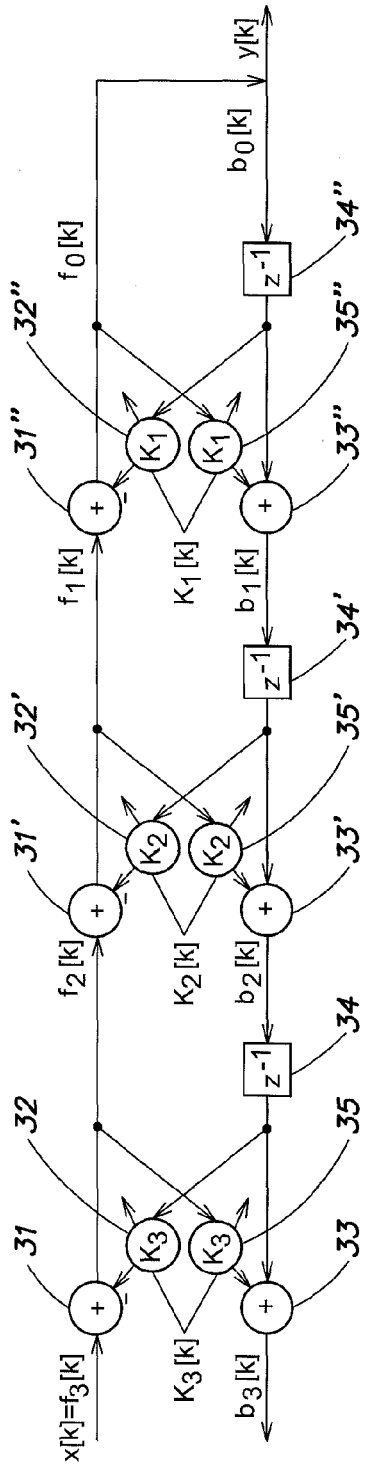
FIG. 10 is a block diagram illustration of a Lattice all-pole $4^{th}$ order filter.

To invert the minimum phase component of the unknown transfer function, the LPC coefficients calculated using the GAL algorithm can be directly inserted, for example, in a Lattice all-pole filter. This type of Lattice all-pole $4^{th}$ order filter is illustrated in FIG. 10, in which the signal $f_3[k]$ forms an input signal x[k] that is applied to a subtraction unit 31, where the subtraction unit 31 also receives a signal from a delay unit 34 via a multiplier unit 32 multiplying it by a constant factor $K_3$. The subtraction unit 31 outputs the signal $f_2[k]$ which is also applied via a multiplier unit 35 for multiplying it by factor $K_3$. Subtraction unit 33 receives the signal $b_2[k]$ delayed by the delay unit 34. The subtraction units 31, 33, the multipliers 32, 35, and the delay unit 34 form a first Lattice stage, which is followed by two additional Lattice stages. The second and third Lattice stages each comprise subtraction units 31', 33', multipliers 32', 35', delay unit 34' or subtraction units 31", 33", multipliers 32", 35", delay unit 34", respectively. Accordingly, the signals $f_3[k]$, $b_2[k]$ are applied to the first stage outputting signals $f_2[k]$ and $b_3[k]$. The signals $f_2[k]$ and $b_1[k]$ are applied to the second stage outputting signals $f_1[k]$ and $b_2[k]$. The signals $f_1[k]$ and $b_0[k]$ are applied to the third stage outputting signals $f_0[k]$ and $b_1[k]$. The signal $f_0[k]$ serves as the signal $b_0[k]$ and as the output signal y[k] of the Lattice all-pole $4^{th}$ order filter.

The direct use of the LPC coefficients is preferred under specific conditions, namely provided sufficient computing time is available depending on the Digital Signal Processor (DSP) used. Lattice filters may require considerably greater computing power. They may be used as a low-noise, dynamic filter structure, since due to their symmetrical structure, lattice filters produce minimal quantization noise. Otherwise, the use of a simple IIR-only filter (e.g., in direct form) is the preferred method since it is relatively easy to implement and more efficient in its application. However, to use a simple IIR filter, the LPC (reflection) filter coefficients are first converted to their appropriate direct form. They can then be further transformed if required into warped filter coefficients, for example.

Direct, broadband use of the GAL algorithm is possible, but requires a relatively large amount of computing time and, similar to the adaptive FIR filter, also suffers from quantization problems if relatively long lengths are used. The direct use of a warped GAL algorithm also experiences the same weaknesses as the direct use of the adaptive warped FIR filter.

Figure 11:
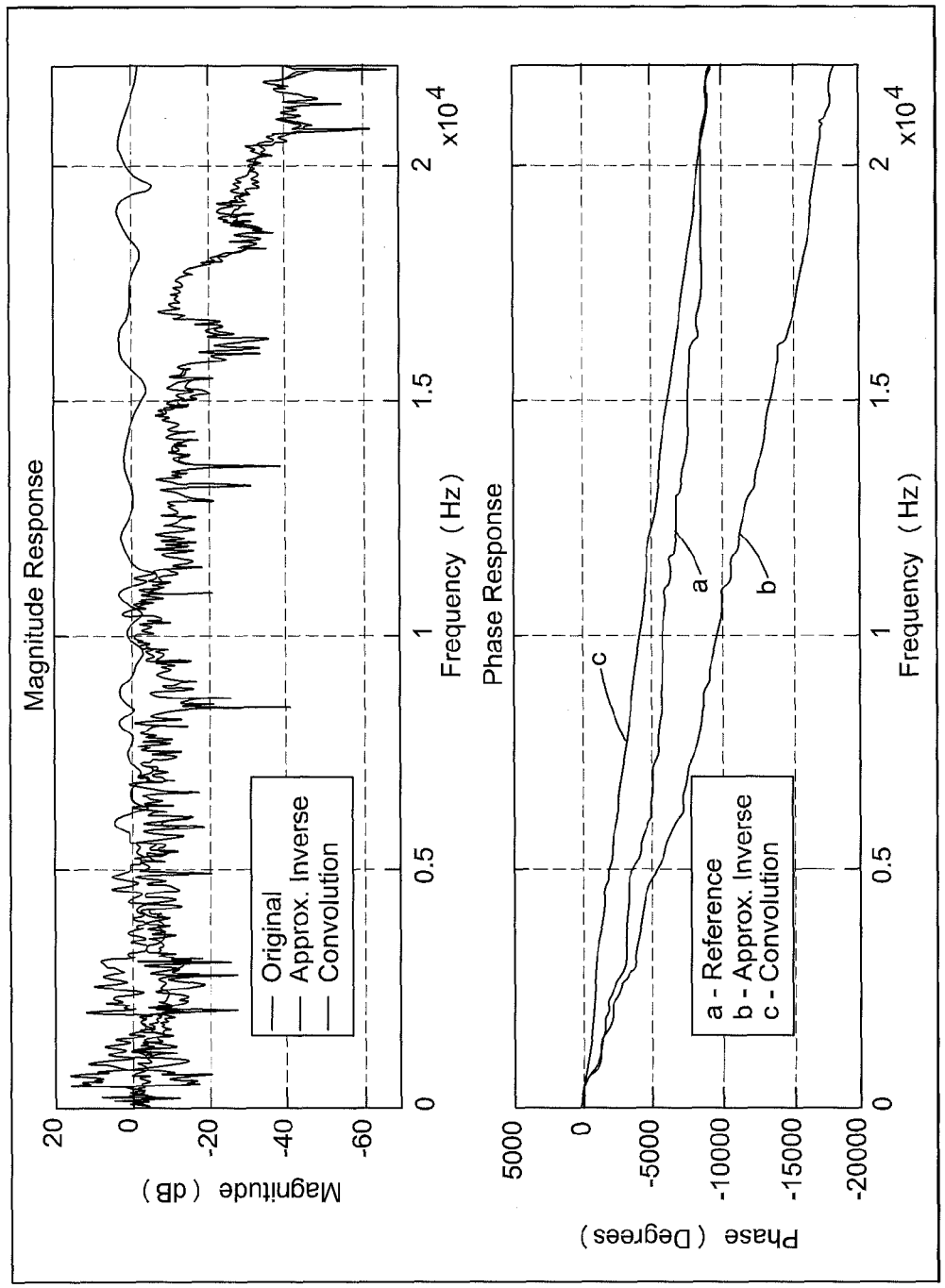
FIG. 11 is a graph illustrating the magnitude response and phase response of a 16-band, critically sampled, inverse sub-band adaptive Gradient Adaptive Lattice (GAL) filter with approximated Bark frequency response.

A relatively efficient application of the GAL algorithm is to embed it in a multi-rate signal processing system. Then, for example, the inverse of the minimum phase component of the unknown transfer function may be directly determined in each sub-band, and converted using the Lattice all-pole filter previously illustrated. A direct implementation in this case moderately extends the computing time since, for a multi-rate system, the complex filters are operated in the undersampled domain. The performance of a 16-band, critically sampled, inverse sub-band adaptive GAL filter with approximated Bark frequency response is illustrated in FIG. 11.

One of ordinary skill in the art will recognize that although certain preferred filtered sizes and configurations have been discussed, various filter sizes and configurations may be used to provide the audio enhancement features using the inventive techniques of the present invention.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. An audio enhancement system that compensates for linear distortions of a sound signal reproduced by an audio system in a listening room, the audio enhancement system comprising:
   a loudspeaker room listener system that receives an input signal and provides a loudspeaker room filtered signal;
   a reference transform that receives the input signal and provides a reference transform signal;
   an analysis filter bank having a plurality of analysis sub-filters, that receives the loudspeaker room filtered signal and generates a plurality of analysis output signals corresponding to different frequency ranges of the loudspeaker room filtered signal;
   a synthesis filter bank having a plurality of synthesis sub-filters, that generates an enhanced audio signal from a plurality of synthesis input signals, where the number of analysis output signals and the number of synthesis input signals are equal; and
   a processing unit connected between the analysis filter bank and the synthesis filter bank, the processing unit including a plurality of adaptive sub-band filters, where each adaptive sub-band filter receives one of the analysis output signals and generates a corresponding one of the synthesis input signals, where each adaptive sub-band filter forms an inverse filter for linearizing an unknown transfer function established by the audio system and the listening room in a respective frequency range;
   a summer that receives the reference transform signal and the enhanced audio signal, and provides an error signal indicative of the difference between the reference transform signal and the enhanced audio signal; and
   an adaption unit that receives the difference signal and the loudspeaker room filtered signal and generates filter coefficients for the plurality of adaptive sub-band filters;
   where the analysis filter bank and the synthesis filter bank each has a non-linear frequency resolution.

2. The audio enhancement system of claim 1, where the adaption unit comprises a Least Mean Square computational unit.

3. The audio enhancement system of claim 1, where at least one of the adaptive sub-band filters comprises an Adaptive Lattice Predictor (ALP) filter.

4. The audio enhancement system of claim 1, where at least one of the adaptive sub-band filters comprises a Lattice all-pole filter.

5. The audio enhancement system of claim 1, where at least one of the adaptive sub-band filters comprises a Gradient Adaptive Lattice (GAL) filter.

6. The audio enhancement system of claim 1, where a length of each of the adaptive sub-band filters is adapted to non-linear frequency resolution.

7. The audio enhancement system of claim 1, where the non-linear frequency resolution is adapted to the Bark scale.

8. The audio enhancement system of claim 1, where the analysis filter bank and the synthesis filter bank each comprise a poly-phase Quadrature Mirror Filter (QMF) bank having connected Infinite Impulse Response (IIR) all-pass filters as sub-band filters.

9. The audio enhancement system of claim 1, where each of the adaptive sub-band filters is operated at a critical sample rate.

10. The audio enhancement system of claim 1, where each of the adaptive sub-band filters is operated at an over-sampled sample rate.

11. An audio enhancement method for compensating for linear distortions of a sound signal reproduced by an audio system in a listening room, the method comprising the steps of:
   receiving an input signal at a loudspeaker room listener system and providing a loudspeaker room filtered signal;
   receiving the input signal at a reference transform and providing a reference transform signal;
   analysis filtering the loudspeaker room filtered signal using non-linear frequency resolution to generate in sub-bands corresponding to different frequency ranges a number of analysis output signals from the loudspeaker room filtered signal;
   synthesis filtering using non-linear frequency resolution to generate an enhanced audio signal from a number of synthesis input signals, where the number of analysis output signals and the number of synthesis input signals are equal; and
   generating one of the synthesis input signals from a respective one of the analysis output signals by performing an inverse filtering for linearizing a transfer function established by the audio system and the listening room in a respective frequency range;
   summing the reference transform signal and the enhanced audio signal to provide an error signal indicative of the difference between the reference transform signal and the enhanced audio signal; and
   processing the difference signal and the loudspeaker room filtered signal to generate filter coefficients for the inverse filtering.

12. The audio enhancement method of claim 11, where the processing step comprises a Least Mean Square processing step.

13. The audio enhancement method of claim 11, where the generating step comprises an Adaptive Lattice Predictor (ALP) filtering step.

14. The audio enhancement method of claim 11, where the generating step comprises a Lattice all-pole filtering step.

15. The audio enhancement method of claim 11, where the generating step comprises a Gradient Adaptive Lattice (GAL) filtering step.

16. The audio enhancement method of claim 11, where the length of the filter used for the step of inverse filtering is adapted to the non-linear frequency resolution.

17. The audio enhancement method of claim 16, where the non-linear frequency resolution is adapted to the Bark scale.

18. The audio enhancement method of claim 11, the steps of analysis filtering and synthesis filtering comprise a poly-phase Quadrature Mirror Filtering (QMF).

19. The audio enhancement method of claim 11, where the steps of analysis filtering and synthesis filtering are performed at a critical sample rate.

20. The audio enhancement method of claim 11, where the steps of analysis filtering and synthesis filtering are performed at an over-sampling sample rate.

* * * * *

UNITED STATES PATENT AND TRADEMARK OFFICE
CERTIFICATE OF CORRECTION

PATENT NO. : 7,881,482 B2
APPLICATION NO. : 11/434496
DATED : February 1, 2011
INVENTOR(S) : Markus Christoph Page 1 of 1

It is certified that error appears in the above-identified patent and that said Letters Patent is hereby corrected as shown below:

Column 3
Line 1, delete "foul's" and insert --forms--

Signed and Sealed this
Twenty-second Day of March, 2011

David J. Kappos
*Director of the United States Patent and Trademark Office*